United States Patent
Moyner et al.

(10) Patent No.: US 10,534,877 B2
(45) Date of Patent: Jan. 14, 2020

(54) ADAPTIVE MULTISCALE MULTI-FIDELITY RESERVOIR SIMULATION

(71) Applicant: Schlumberger Technology Corporation, Sugar Land, TX (US)

(72) Inventors: Olav Moyner, Oslo (NO); Knut-Andreas Lie, Hosle (NO); Jostein Natvig, Asker (NO)

(73) Assignee: Schlumberger Technology Corporation, Sugar Land, TX (US)

( * ) Notice: Subject to any disclaimer, the term of this patent is extended or adjusted under 35 U.S.C. 154(b) by 501 days.

(21) Appl. No.: 15/157,172

(22) Filed: May 17, 2016

(65) Prior Publication Data
US 2016/0342718 A1   Nov. 24, 2016

Related U.S. Application Data

(60) Provisional application No. 62/163,614, filed on May 19, 2015.

(51) Int. Cl.
*G06F 17/50* (2006.01)
*E21B 47/06* (2012.01)
(Continued)

(52) U.S. Cl.
CPC .......... *G06F 17/5018* (2013.01); *E21B 47/06* (2013.01); *G06F 17/12* (2013.01); *G01V 11/00* (2013.01)

(58) Field of Classification Search
CPC ...... G06F 17/5018; G06F 17/12; E21B 47/06; G01V 11/00
See application file for complete search history.

(56) References Cited

U.S. PATENT DOCUMENTS 6,230,101 B1 *  5/2001  Wallis ............... G06T 17/00
                                                   702/14
2008/0208539 A1 *  8/2008  Lee ............... E21B 49/00
                                                   703/1
(Continued)

FOREIGN PATENT DOCUMENTS

WO    1999/40532 A1    8/1999
WO    2008/070990 A1   6/2008
WO    2013/119906 A1   8/2013

OTHER PUBLICATIONS

OlavMøyner, Knut-AndreasLie, A multiscale restriction-smoothed basis method for high contrast porous media represented on unstructured grids, Journal ofComputationalPhysics304(2016)46-71 (Year: 2016).*

(Continued)

*Primary Examiner* — Rehana Perveen
*Assistant Examiner* — Chuen-Meei Gan
(74) *Attorney, Agent, or Firm* — Jaime A. Castano

(57) ABSTRACT

Computer-implemented systems and methods for modeling behavior of at least one fluid in a reservoir are disclosed. The techniques can include obtaining measurements of physical parameters, including pressure, at locations within the reservoir, and discretizing, based on a three-dimensional fine grid, a system of partial differential mass balance equations that model, based on the measurements, at least the physical parameters at the locations within the reservoir, such that a system of nonlinear equations is produced. The techniques can include iterating from a current time step to a next time step, such that a solution to the system of nonlinear equations for a time interval that includes the current time step and the next time step is produced. The iterating can include an adaptive multi-fidelity multiscale technique that employs multiple restriction operators, prolongation operators, and (Continued)

coarse grids, to model various computationally challenging reservoir features, behaviors, or both.

20 Claims, 8 Drawing Sheets

(51) Int. Cl.
*G06F 17/12* (2006.01)
*G01V 11/00* (2006.01)

(56) References Cited

U.S. PATENT DOCUMENTS

| | | | |
|---|---|---|---|
| 2009/0119082 | A1 | 5/2009 | Fitzpatrick et al. |
| 2009/0319242 | A1* | 12/2009 | Lee .................. E21B 43/00 703/10 |
| 2010/0004908 | A1* | 1/2010 | Lunati ............... G06F 17/5018 703/2 |
| 2010/0057413 | A1* | 3/2010 | Lee .................. G06F 17/5009 703/2 |
| 2010/0094605 | A1* | 4/2010 | Hajibeygi .......... G06F 17/5018 703/2 |
| 2011/0191080 | A1* | 8/2011 | Klie .................. G06F 17/50 703/10 |

OTHER PUBLICATIONS

Swej Shaha, Olav Møyner, Matei Tene, Knut-Andreas Lie, Hadi Hajibeygi, The multiscale restriction smoothed basis method for fractured porous media (F-MsRSB), Journal ofComputationalPhysics318(2016)36-57 (Year: 2016).*

Ivan Lunati and Seong H. Lee, An Operator Formulation of the Multiscale Finite-Volume Method With Correction Function, Multiscale Model. Simul. 2009 Society for Industrial and Applied Mathematics vol. 8, No. 1, pp. 96-109 (Year: 2009).*

Knut-Andreas Lie et al, Open-source MATLAB implementation of consistent discretisations on complex grids, Connput Geosci (2012) 16:297-322 (Year: 2012).*

Olav Møyner, Multiscale Finite volume Methods, Master of Science in Physics and Mathematics, Department of Mathematical Sciences Submission date: Jun. 2012 (Year: 2012).*

Olav Møyner et al, A Multiscale Method Based on Restriction-Smoothed Basis Functions Suitable for General Grids in High Contrast Media, This paper was prepared for presentation at the SPE Reservoir Simulation Symposium held in Houston, Texas, USA, Feb. 23-25, 2015. (Year: 2015).*

Olav Møyner et al, The Multiscale Finite-volume Method on Stratigraphic Grids, This paper was prepared for presentation at the SPE Reservoir Simulation Symposium held in The Woodlands, Texas USA, 1820 Feb. 2013. (Year: 2013).*

Chapter 4 Partitions of Unity and Smooth Functions, p. 1-6 (Year: 2002).*

How to understand degrees of freedom? p. 1-8 (Year: 2011).*

Kwok, Wing Hong Felix. "Scalable Linear and Nonlinear Algorithms for Multiphase Flow in Porous Media." PhD diss., Stanford University, 2007 (Year: 2007).*

Moyner, et al., "A Multiscale Two-Point Flux-Approximation Method," Journal of Computational Physics, vol. 275, Oct. 25, 2013, pp. 273-293.

Zhou, et al., "Two-Stage Algebraic Multiscale Linear Solver for Highly Heterogeneous Reservoir models," SPE Journal, Jun. 1, 2012, pp. 523-539.

Graham, et al., "Domain decomposition for multiscale PDEs," Numerische Mathematic, Springer, Berlin, De, vol. 106, No. 4, Apr. 19, 2007, pp. 589-626.

Partial Search Report for the equivalent European patent application 16170490.3 dated Oct. 5, 2016.

Search Report for the equivalent European patent application 16170490.3 dated Jan. 25, 2017.

* cited by examiner

ADAPTIVE MULTISCALE MULTI-FIDELITY RESERVOIR SIMULATION

CROSS-REFERENCE TO RELATED APPLICATION

The present application claims the benefit of, and priority to, U.S. Provisional Patent Application No. 62/163,614 entitled, "AN ADAPTIVE MULTISCALE METHOD BASED ON A WEIGHTED JACOBI SMOOTHING SUITABLE FOR GENERAL", and filed May 19, 2015, which is hereby incorporated by reference in its entirety.

BACKGROUND

Simulating reservoir behavior using computer models can provide information that can guide petroleum extraction efforts. Therefore, petroleum extraction may be performed together with simulation of the respective reservoir's behavior. However, reservoirs can include complex geometry and experience complicated actions. Examples of such geometry and actions include high-contrast fluvial sands, fractured carbonate reservoirs, other fractures, faults, pinch-outs, wells that get turned on or off, and wells that exhibit large changes in well controls. Reservoirs with these and other features can be difficult to accurately simulate using computer models.

The multi-scale method is a reservoir simulation technique that has been demonstrated to offer order-of-magnitude speed-up of reservoir simulations relative to prior techniques. However, the multi-scale method lacks the ability to individually or separately consider complex features in reservoir geology, fluid behavior or driving forces.

SUMMARY

According to some examples, a computer-implemented method for modeling behavior of at least one fluid in a reservoir is disclosed. The method includes obtaining a plurality of measurements of a plurality of physical parameters at a plurality of locations within the reservoir, the plurality of physical parameters comprising at least pressure; discretizing, based on a three-dimensional fine grid, a system of partial differential mass balance equations that model, based on the plurality of measurements, at least the plurality of physical parameters at the plurality of locations within the reservoir, whereby a system of nonlinear equations is produced; iterating from a current time step to a next time step, whereby a solution to the system of nonlinear equations for a time interval that includes the current time step and the next time step is produced: deriving a system of nonlinear pressure equations from the system of nonlinear equations; linearizing the system of nonlinear pressure equations to obtain a system of linearized pressure equations; selecting a plurality of three-dimensional coarse grids, wherein each coarse grid comprises a non-overlapping partition of the fine grid; selecting a plurality of prolongation operators, each prolongation operator associated with a respective coarse grid; selecting a plurality of restriction operators, each restriction operator associated with a respective coarse grid; solving for pressure for the next time step at the plurality of locations within the reservoir based on a solution to the system of linearized pressure equations, wherein the solving comprises applying the plurality of prolongation operators and the plurality of restriction operators to the system of linearized pressure equations to generate a reduced-dimension system of linear pressure equations, wherein the reduced-dimension system of linear pressure equations has a lower dimensionality than a dimensionality of the system of linearized pressure equations; and determining, based on the pressure for the next time step at the plurality of locations within the reservoir, physical parameters at the plurality of locations within the reservoir for the next time step; and outputting the solution to the system of nonlinear equations for the time interval.

Various optional features of the above examples include the following. The solving for pressure at the next time step at the plurality of locations within the reservoir based on a solution to the system of linearized pressure equations may include iteratively: applying at least one prolongation operator of the plurality of prolongation operators to a free variable representing a solution to the system of linearized pressure equations; and applying at least one restriction operator of the plurality of restriction operators to both sides of the system of linearized pressure equations, whereby the reduced-dimension system of linear pressure equations is produced. The solving for pressure at the next time step at the plurality of locations within the reservoir based on a solution to the system of linearized pressure equations may further include iteratively applying a local linear solver for the linearized pressure equations to a prolongation of a solution to the reduced-dimension system of linear equations. Each column of each prolongation operator of the plurality of prolongation operators may have an associated support that is compact and includes a coarse grid block from a respective coarse grid; and each prolongation operator of the plurality of prolongation operators may be a plurality of columns that form a partition of unity over the fine grid. Each row of each prolongation operator of the plurality of prolongation operators may sum to unity. The outputting may include displaying a representation of a behavior of the at least one fluid in the reservoir. The method may include predicting fluid behavior in the reservoir based on the solution to the system of nonlinear equations for the time interval; and extracting fluid from the reservoir based on the predicting. The iterating from the current time step to the next time step may be performed in parallel by at least one hardware graphics processing unit. The physical parameters may include pressure, flow rate, and composition. The system of partial differential mass balance equations that model at least the plurality of physical parameters at the plurality of locations within the reservoir may further model a modification of the reservoir.

According to various examples, a non-transitory computer-readable medium containing instructions which, when executed by at least one electronic processor, perform a method for modeling behavior of at least one fluid in a reservoir is disclosed. The method includes obtaining a plurality of measurements of a plurality of physical parameters at a plurality of locations within the reservoir, the plurality of physical parameters comprising at least pressure; discretizing, based on a three-dimensional fine grid, a system of partial differential mass balance equations that model, based on the plurality of measurements, at least the plurality of physical parameters at the plurality of locations within the reservoir, whereby a system of nonlinear equations is produced; iterating from a current time step to a next time step, whereby a solution to the system of nonlinear equations for a time interval that includes the current time step and the next time step is produced: deriving a system of nonlinear pressure equations from the system of nonlinear equations; linearizing the system of nonlinear pressure equations to obtain a system of linearized pressure equations; selecting a plurality of three-dimensional coarse grids, wherein each coarse grid comprises a non-overlapping partition of the fine grid; selecting a plurality of prolongation operators, each prolongation operator associated with a respective coarse grid; selecting a plurality of restriction operators, each restriction operator associated with a respective coarse grid; solving for pressure for the next time step at the plurality of locations within the reservoir based on a solution to the system of linearized pressure equations, wherein the solving comprises applying the plurality of prolongation operators and the plurality of restriction operators to the system of linearized pressure equations to generate a reduced-dimension system of linear pressure equations, wherein the reduced-dimension system of linear pressure equations has a lower dimensionality than a dimensionality of the system of linearized pressure equations; and determining, based on the pressure for the next time step at the plurality of locations within the reservoir, physical parameters at the plurality of locations within the reservoir for the next time step; and outputting the solution to the system of nonlinear equations for the time interval.

Various optional features of the above examples include the following. The solving for pressure at the next time step at the plurality of locations within the reservoir based on a solution to the system of linearized pressure equations may include iteratively: applying at least one prolongation operator of the plurality of prolongation operators to a free variable representing a solution to the system of linearized pressure equations; and applying at least one restriction operator of the plurality of restriction operators to both sides of the system of linearized pressure equations, whereby the reduced-dimension system of linear pressure equations is produced. The solving for pressure at the next time step at the plurality of locations within the reservoir based on a solution to the system of linearized pressure equations may further include iteratively applying a local linear solver for the linearized pressure equations to a prolongation of a solution to the reduced-dimension system of linear equations. Each column of each prolongation operator of the plurality of prolongation operators may have an associated support that is compact and includes a coarse grid block from a respective coarse grid; and each prolongation operator of the plurality of prolongation operators may be of a plurality of columns that form a partition of unity over the fine grid. Each row of each prolongation operator of the plurality of prolongation operators may sum to unity. The outputting may include displaying a representation of a behavior of the at least one fluid in the reservoir. The computer-readable medium may further contain instructions which, when executed by the at least one electronic processor, further perform a method including predicting fluid behavior in the reservoir based on the solution to the system of nonlinear equations for the time interval; and extracting fluid from the reservoir based on the predicting. The iterating from the current time step to the next time step may be performed in parallel by at least one hardware graphics processing unit. The physical parameters may include pressure, flow rate, and composition. The system of partial differential mass balance equations that model at least the plurality of physical parameters at the plurality of locations within the reservoir may further model a modification of the reservoir.

Techniques for simulating fluid behavior in simple reservoirs are known. Such techniques may be used to model the behavior of a fluid, such as petroleum, in order to make decisions about extraction. Such technique may also be used to model potential changes to the reservoir in order to predict whether proposed extraction tactics would be beneficial. However, existing reservoir simulation techniques are highly inefficient and use large amounts of time and processing power to handle complex reservoir features such as complicated geometry or fluid behavior, particularly when multiple such features are present. Such problematic features include high-contrast fluvial sands, fractured carbonate reservoirs, other fractures, faults, pinch-outs, wells that get turned on or off, and wells that exhibit large changes in well controls. Existing reservoir simulation techniques do not provide sufficient efficiency or accuracy for reservoirs that include a plurality of such features.

The foregoing summary is presented merely to introduce some of the aspects of the disclosure, which are described in greater detail below. Accordingly, the present summary is not intended to be limiting.

BRIEF DESCRIPTION OF THE DRAWINGS

The accompanying drawings, which are incorporated in and constitute a part of this specification, illustrate examples of the present teachings and together with the description, serve to explain the principles of the present teachings. In the figures.

DETAILED DESCRIPTION

Figure 1:
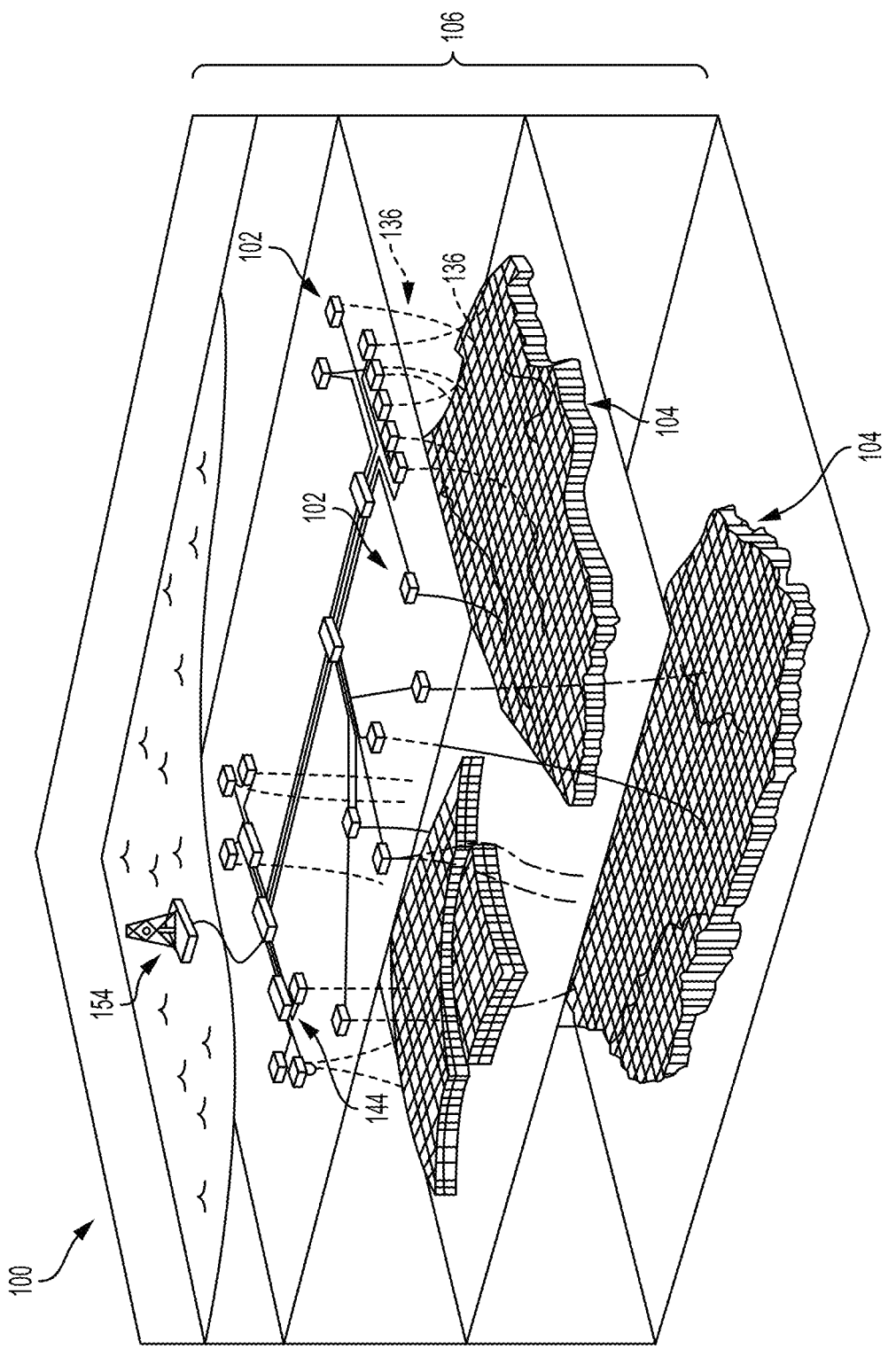
FIG. 1 illustrates an oilfield in accordance with some examples disclosed herein.

The following detailed description refers to the accompanying drawings. Wherever convenient, the same reference numbers are used in the drawings and the following description to refer to the same or similar parts. While several examples and features of the present disclosure are described herein, modifications, adaptations, and other implementations are possible, without departing from the spirit and scope of the present disclosure.

I. Introduction

In general, examples of the present disclosure may provide systems, methods, and computer-readable media for an adaptive, multi-fidelity, multiscale method of reservoir simulation. The disclosed techniques provide an adaptive and flexible framework to combine many multiscale approximations, hence, "multi-fidelity", each of which targets a particular computational challenge. This framework can increase the accuracy and efficiency of multiscale technology and make possible the combination of multiscale approximations with different resolution, as well as multiscale approximation targeting. This may be useful for simulating reservoirs that include, for example, high-contrast fluvial sands, fractured carbonate reservoirs, other fractures, faults, pinch-outs, wells that get turned on or off, and wells that exhibit large changes in well controls, etc. Thus, some examples allow users to model much more complex reservoirs (such as those with more complex fluids and geologies) with greater speed and flexibility than is available by the current state-of-the art computational technologies.

The disclosed reservoir simulation techniques may be used to guide subsequent or ongoing petroleum extraction efforts. For example, the techniques may be used to simulate how fluids in a reservoir will behave after a proposed reservoir modification is implemented. Such simulations may save vast amounts of time and expenses by predicting future performance, thereby allowing extraction operators to implement those changes which resulting simulated future behavior is favorable.

The various multiscale approximations may aim to add efficiency and accuracy to a simulation model based on knowledge about different parts of the reservoir and production model. Software, for example, may hold information about the geo-model that is converted to a simulation model. Some information may be removed during the process, such as geological facies, the geometry and location of geo-bodies, etc. This information may be extracted and used to improve the multiscale approximations or apply different approximations for different entities.

FIG. 1 illustrates an oilfield 100 in accordance with implementations of various technologies and techniques described herein. As shown, the oilfield has a plurality of wellsites 102 operatively connected to central processing facility 154. The oilfield configuration of FIG. 1 is not intended to limit the scope of the oilfield simulation system. Part, or all, of the oilfield may be on land and/or sea. Also, while a single oilfield with a single processing facility and a plurality of wellsites is depicted, any combination of one or more oilfields, one or more processing facilities and one or more wellsites may be present.

Each wellsite 102 has equipment that forms wellbores 136 into the earth. The wellbores extend through subterranean formations 106, including reservoirs 104. These reservoirs 104 contain fluids, such as hydrocarbons. The wellsites draw fluid from the reservoirs and pass them to the processing facilities via surface networks 144. The surface networks 144 have tubing and control mechanisms for controlling the flow of fluids from the wellsite to processing facility 154.

Reservoir simulation may be used to model the behavior of one or more reservoirs, e.g., 104 of FIG. 1. Some disclosed examples provide a technique for accurately modeling reservoir behavior. Some examples are particularly suited for modeling behavior in the presence of complex reservoir geometry, such as fractures, river beds, fracture swarms, fault lines, etc. An introduction to basic modeling techniques follows in this section.

In reservoir simulation, a system of mass balance equations may be solved to determine the reservoir pressure and fluid composition at various locations within the reservoir. Each mass balance equation describes the evolution of one fluid species c in a porous medium $\Omega$ in which multiple fluid species exist in n phases. When discretized in time and space, these equations form a system of nonlinear (algebraic) equations, which may be represented, by way of non-limiting example, as follows.

$$F_c(p, S_1, \ldots, S_n, x_{c1}, \ldots, x_{cn}) = q_c, \text{ for } c=1, \ldots, m \quad (1)$$

In Equation (1), $F_c$ represents a coupled system of differential equations, p represents pressure, the $S_i$ represent saturations of various fluid phases (e.g., oil, gas, water, etc.), and the $x_{ci}$ may represent mass or molar fraction of fluid component c in fluid phase i (e.g., the fraction of the methane component in the oil phase). Equation (1) represents m fluid components. Given a known pressure and fluid distribution at time t, the system of equations provided by Equation (1) can be solved to determine the reservoir pressure p and distribution of fluid species (in terms of phase saturations $S_\alpha$ and molar fractions $x_{c\alpha}$) after a time interval $\Delta t$ has elapsed, i.e., at time t+$\Delta t$. Example values for $\Delta t$ include, e.g., 1 minute, 5 minutes, 10 minutes, 30 minutes, 1 hour, 1 day, one week, one month, one year, etc. That is, $\Delta t$ may be any time interval from one minute to one year or more. For fluids such as carbon dioxide, $\Delta t$ may be on the order of a year, several years, or even a decade or more. By manipulating the system of nonlinear equations of Equation (1), it is possible to form a nonlinear system of equations for the reservoir pressure p at time t+$\Delta t$, which may be expressed, by way of non-limiting example, as follows.

$$F_p(p)=0. \quad (2)$$

This forms the basis for many commonly applied solution procedures for the nonlinear system of Equation (1). To solve the system of non-linear pressure equations provided by Equation (2), some techniques linearize Equation (2) around some initial guess $p_0$ and solve, by way of non-limiting example, the following system of linearized pressure equations to obtain a better estimate $p_1 = p_0 + \delta p$.

$$A\delta p = F_0 \quad (3)$$

In Equation (3), A is the Jacobian matrix of Equation (2), and $F_0 = F_p(p_0)$. The procedure can be iterated (e.g., repeated) until a sufficiently converged pressure solution is obtained. This involves repeatedly obtaining solutions of the large, sparse, and ill-conditioned system of linearized pressure equations provided by Equation (3). Once reservoir pressures at time t+$\Delta t$ is known, total volumetric fluxes can then be computed, and the transport of fluid species over the time step can be computed by solving Equation (1). This may involve a fractional formulation, in which each phase flux is expressed as a fraction of the total volumetric flux, and the saturation and fluid composition is evolved a time step $\Delta t$, while keeping the pressure and volumetric fluxes fixed.

Multiscale methods are well-suited to solve Equation (3). They are designed to provide an approximate solution of Equation (3), by reducing the size and condition number of the coefficient matrix A. Multiscale methods may be adapted to target challenging modeling features in reservoir simulation, such as high contrast rock heterogeneity, channels and fractures, complex wells, and locally increased grid resolution. Each of these features of a simulation model can create difficulties in the solution of Equation (1).

Disclosed herein is a flexible method to combine multiscale approximations for different modeling features into one coherent framework. By implementing each modeling feature with a separate and complete multiscale approximation, it can be enabled or disabled by the user or automatically and adaptively as needed in the simulation. Alternately, or in addition, the disclosed techniques can combine more than one feature in a single multiscale approximation, e.g., in a combination of two or more multiscale approximation that each target one or more features. Initial tests show that this can provide better overall accuracy and efficiency of the multiscale approximation.

The techniques can be used to leverage information available in modeling software in ways that may not be currently possible. In some approaches, the geological model and production system is converted to transmissibilities, porosities and well-connection factors for the simulation grid. This process effectively filters out much information that can be hard to recreate from, e.g., transmissibilities alone. Information that may be useful to make multiscale approximations can for instance be geological facies, the geometry and location of geo-bodies, shape of riverbed channels, fractures at or below simulation grid resolution, reservoir compartmentalization etc. A coherent multiscale framework that leverages information from software systems about reservoir and production systems can help a multiscale simulation engine make improved simulations.

II. Basic Multiscale Techniques

The fine-scale discretization in Equation (1) is given on a fine simulation grid that also holds the petrophysical properties, boundary conditions, well models, etc. State-of-the-art multiscale methods use a non-overlapping partition $\{\Omega_i\}$ of the simulation grid to solve Equation (3). Multiscale methods are systematic methods to create and maintain a high-quality linear prolongation operator P that takes a vector $p_c$ of pressure unknowns associated with the coarse scale defined by the grid blocks in $\{\Omega_i\}$ and returns a vector of pressure values $Pp_c$ at the fine scale, i.e., for cells in the simulation grid. This prolongation operator can be used to create a smaller linear system for the coarse pressure increments, which may be represented, by way of non-limiting example, as follows.

$$A_c \delta p_c = F_c \quad (4)$$

In Equation (4), $A_c = RAP$ and $F_c = RF_0$. The matrix R is a (linear) restriction operator. The restriction operator determines how the linear equations of Equation (3) are combined to form a coarse-scale pressure system. Two choices are common in the multiscale literature. One is a so-called finite volume summation operator given by $$R_{ij} = \begin{cases} 1, & \text{if } j \in \Omega_i, \\ 0, & \text{otherwise.} \end{cases} \quad (5)$$

The class of multiscale finite-volume methods (MSFV) uses the finite-volume restriction operator to form the coarse-scale operator $A_c$. Another common approach is to use $R=P^T$, which results in what is commonly known as a Galerkin coarse operator $A_c$. After solving the linear system of Equation (4), the technique can approximate the reservoir pressure by $p_1 = p_0 + \delta p$, where $$\delta p = P \delta p_c.$$

The new pressure $p_1$ is a multiscale approximation to the solution of Equation (3). This approximation can be iteratively refined by repeating the process referenced above with respect to Equations (4)-(5), possibly in combination with a local solver. One choice of local solver can be an incomplete LU factorization (ILU-0).

The remaining solution procedure may occur in two steps. First, face fluxes from cell to cell may be calculated on the fine grid, and then these fluxes may be used to evolve the phase saturations and molar fractions on the fine grid (or on a coarse partition of the fine grid).

To compute fluxes, some techniques apply Darcy's law to each interface in the fine and coarse grids. That is, the face fluxes between coarse blocks may be computed from the block values $p_c$, while the fine cell-cell fluxes may be computed from the prolonged pressure values $Pp_c$. However, to ensure that the fine-scale fluxes are locally mass conservative, some techniques optionally reconstruct the fine-scale fluxes by solving a local pressure equation subject to boundary conditions given by the coarse fluxes.

Finally, the phase fluxes in Equation (1) may be written in terms of volumetric fluxes and then (a subset of) the conservation equations of Equation (1) may be solved to compute phase saturations $S_\alpha$ and molar fractions $x_{c\alpha}$ at time $t+\Delta t$ on the fine grid (or on any coarse partition thereof). The solution process may be augmented by an outer iteration to ensure improved consistency between reservoir pressure, phase saturations and molar fractions.

A multiscale formulation referred to as the multiscale restricted-smoothing basis (MsRSB) method may be used within the disclosed framework. In this formulation, basis functions (each of which forms a column of the prolongation operator P) may be computed based on a constrained weighted Jacobi smoothing. The technique uses a partition of the (fine) simulation grid into non-overlapping subdomains $\Omega_i$, called a coarse grid, and a set of support regions $S_i \supset \Omega_i$, one for each coarse block $\Omega_i$.

Figure 2:
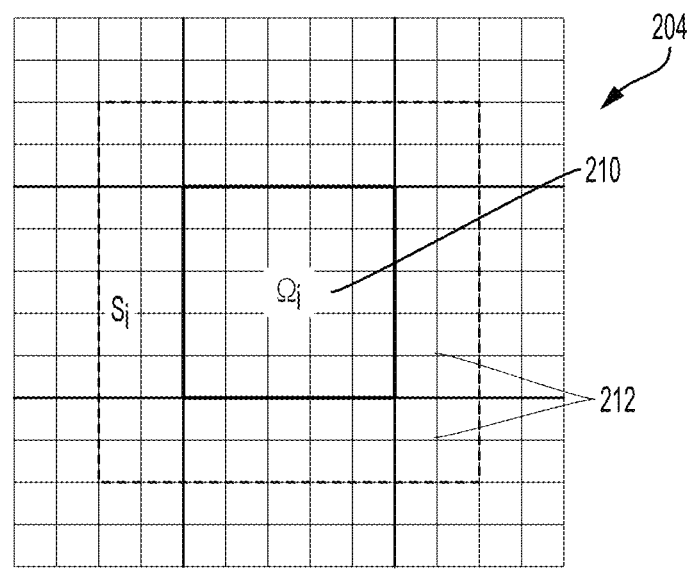
FIG. 2 illustrates a conceptual, schematic view of simulation grids.

FIG. 2 illustrates a conceptual, schematic view of suitable fine and coarse simulation grids. In particular, FIG. 2 depicts two-dimensional grid 204. (Note that examples may utilize two-dimensional or three-dimensional grids.) Grid 204 is partitioned into a fine grid, with a 13 by 13 partition illustrated. Grid 204 is also partitioned into a coarse grid, where each coarse partition square consists of a square that is five by five in the fine partition. Grid 204 depicts coarse grid subdomain $\Omega_i$ 210 and corresponding support region $S_i \supset \Omega_i$ 212.

What sets the MsRSB method apart from previous multiscale methods are the mild requirements on the coarse grid used to compute basis functions and the approach used to provide localization.

The multiscale basis functions for MsRSB may be constructed as follows. Starting from a constant initial basis function $P_i^0$ that is 1 in $\Omega_i$ and 0 outside, an iterative smoothing procedure may be applied one or many times to give a function that is algebraically smooth. Suitable smoothing procedures include symmetric Gauss-Seidel and constrained weighted Jacobi iteration. Constrained weighted Jacobi iteration is described in detail presently. This technique gives basis functions $P_i^\nu$ with smaller localization error than the standard MSFV method and is easily applicable to complex reservoir grids with faults, pinched layers, inactive cells, local grid refinement, non-neighbor connections, etc. Moreover, this technique is robust with respect to high aspect ratios and high contrast permeability. Thus, the constrained weighted Jacobi iteration given in Algorithm 1 below ensures that each basis function $P_i$ is zero outside its prescribed support region $S_i$, provides a partition of unity, and is algebraically smooth.

Algorithm 1 (Constrained Jacobi Iteration)
Let

1. Set $P_i = P_i^\nu + \omega D^{-1} A P_i^\nu$ in $S_i$    (Jacobi iteration)

2. Set $P_i$ to zero outside $S_i$    (compact support)

3. Set $P_{ij}^{\nu+1} = \dfrac{P_{ij}}{\Sigma_i P_{ij}}$, in cell $j$    (partition of unity)

Then iterate:

$$P_i^0 = \begin{cases} 1, & \text{in } \Omega_i, \\ 0, & \text{otherwise.} \end{cases}$$

Repeat 1-3 until $\|P_i^{v+1} - P_i^v\|$ is sufficiently small.

Figure 3:
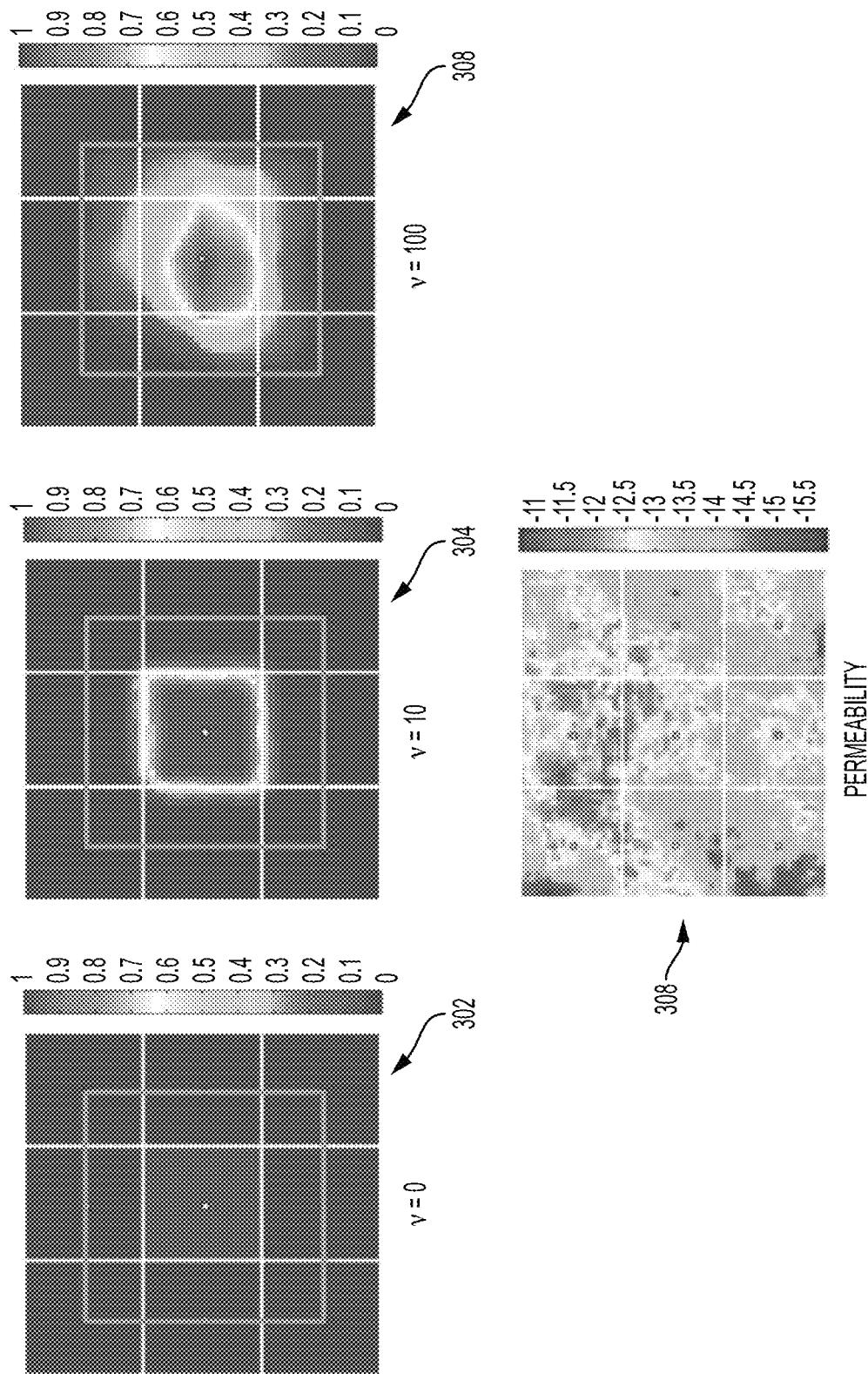
FIG. 3 illustrates shape functions and a permeability field.

FIG. 3 illustrates shape functions and a permeability field. In particular, FIG. 3 shows a basis function $P_i^v$ on a coarse grid (e.g., 204 of FIG. 1) after zero (302), ten (304) and one hundred (306) iterations of the constrained Jacobi iteration. Permeability field 308 is also depicted.

III. Multiscale Techniques for Multi-Fidelity Reservoir Simulation

To create an efficient solution algorithm, state-of-the-art multiscale methods either use a single coarse grid with an associated set of basis functions, or a set of nodal basis functions and local enrichments that are combined in a hybrid finite-volume/Galerkin formulation. This disclosure describes an extension of existing multiscale methods to multiple sets of coarse grids and basis functions. This document includes disclosure of both a framework for flexible and adaptive application of many multiscale approximations simultaneously, and a description of how these multiscale approximations can be realized based on meta-information available in state-of-the-art geo-modeling tools.

Figure 4:
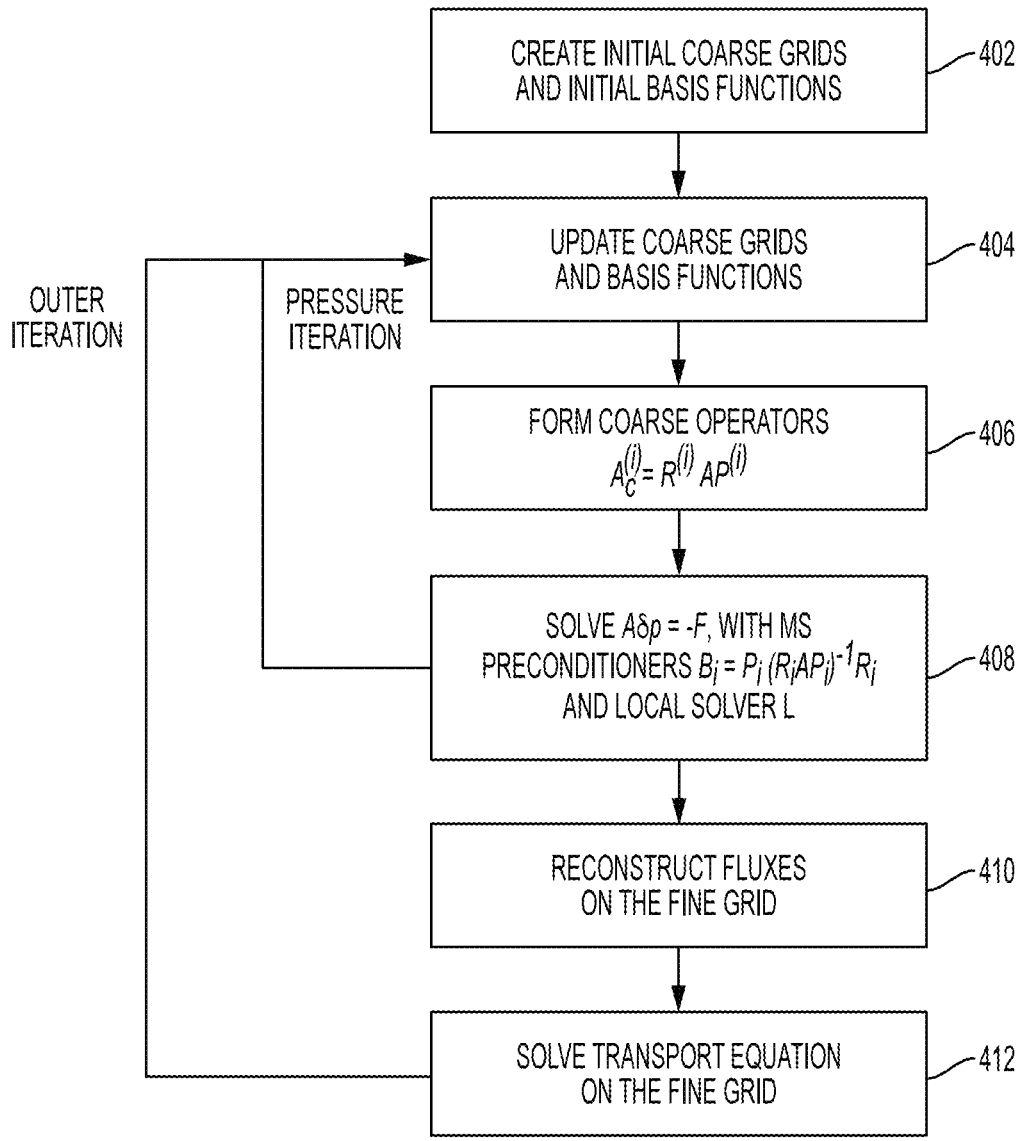
FIG. 4 is a flowchart illustrating a portion of a process according to an example.

FIG. 4 is a flowchart illustrating a portion of a process according to an example. The portion of the process depicted by FIG. 4 involves a nested iteration of an adaptive multi-fidelity multiscale technique for reservoir simulation. The disclosed techniques are particularly amendable to parallelization. Note that computations from either or both of the outer and inner iteration loops may processed completely or partially in parallel, e.g., using one or more graphics processing units as shown and described herein in reference to FIG. 8. The process of FIG. 4 will be described throughout this section.

Some examples provide a model of multiphase and multicomponent flow in porous media that allows for the separation of a pressure equation as described in Section I. This gives a sequential implicit solution procedure for the mass balance equations of Equation (1) in which pressure is computed first, then volumetric face fluxes are calculated before phases and fluid compositions are computed by solving Equation (1) with fixed cell pressures and volumetric cell-to-cell fluxes.

Suitable multiscale techniques that fit the framework described in Section I may be used if they include the following three features:

(1) The prolongation operator P for pressure and the restriction operator R are constructed using coarse grid blocks $\Omega_i$ that are non-overlapping partitions of the fine grid. Each column in P is referred to as a basis function and is associated with a coarse grid block.

(2) The support of each basis function is compact and contains the associated coarse block. Hence, for the support region $S_i$ of the i-th basis function, $\Omega_i \subseteq S_i \subseteq \Omega$.

(3) The columns of P form a partition of unity over the fine grid. In practice, this means that each row in P has unit row sum.

An example of a multiscale method that fits this description is the MsRSB method. This method may be used to create initial coarse grids and initial basis functions 402 for the process of FIG. 4. As described in Section II above, a prolongation operator P for pressure and a restriction operator R can be used to approximate the solution to a linear system for pressure increments, Equation (4). This technique may be used to create multiple prolongation and restriction operators 406. In some formulations, the unknowns are pressure increments and in some formulations the unknowns are pressures. In either case, let x be the vector of unknowns for the linearized pressure equation, which may be expressed, by way of non-limiting example, as follows:

$$Ax=b. \quad (6)$$

Equations (7)-(10) below may be used to solve for pressure at a next time step, as described presently. The product Py may be substituted for the vector of unknowns x follows.

$$x=Py. \quad (7)$$

Thus, Equation (7) represents applying a prolongation operator to a free variable representing a solution to the system of linearized pressure equations represented by Equations (3), (4) and (6). Left multiplying Equation (6) by R and performing the substitution of Equation (7) provides a linear system for y of smaller dimension than Equation (6). This reduced-dimension system of linear pressure equations may be represented, by way of non-limiting example, as follows.

$$RAPy=Rb. \quad (8)$$

Thus, Equation (8) represents the results of applying a restriction operator to both sides of the system of linearized pressure equations represented by Equation (6) after having performed the substitution of Equation (7). A multiscale approximation for the solution x of Equation (6) can be obtained by solving Equation (8) and applying Equation (7) to yield, by way of non-limiting example, the following.

$$x=P(RAP)^{-1}Rb \quad (9)$$

If one combines the multiscale approximation with a local linear solver L, the final approximation for Equation (6) becomes, for example, the following.

$$x^1=Lx \quad (10)$$

That is, some examples iteratively apply the local linear solver of Equation (10) for the linearized pressure equations of Equation (6) to a prolongation of a solution to the reduced-dimension system of linear equations provided by Equation (8). The combined process described herein in reference to Equations (7)-(10) may be repeated to yield a convergent iterative solver for Equation (6). Thus, this same process may be used to perform the actions of block 408 of FIG. 4.

At blocks 410 and 412, the technique reconstructs fluxes on the fine grid and solves the transport equation on the fine grid, respectively, to accurately model fluid presence at multiple locations within the reservoir. These actions are described herein in Section II, above, and in reference to FIG. 6, below.

Some examples combine N different multiscale approximations (e.g., Equation (9)) with multiple prolongation and restriction operators $P_1, \ldots, P_N$ and $R_1, \ldots, R_N$, each associated with a coarse grid and a set of corresponding support regions. The N multiscale approximations can have different choices of coarse grids and support regions, and can also come from different types of multiscale methods. For each multiscale approximation, the initial coarse blocks, support regions, and basis functions may be created at the start of the simulation.

Each multiscale approximation can be written as a linear operation $x_i=B_ib=P_i(R_iAP_i)^{-1}R_ib$, and the solution of the linearized pressure equation of Equation (6) can effectively be found by iteratively applying all or some of these multiscale approximations and the local solver L in an iterative manner.

The combined adaptive multiscale preconditioner B can be formed in an additive manner (all preconditioners applied independently of each other) or in a multiplicative manner (all preconditioners applied in sequence). For two multiscale approximations, the additive and multiplicative versions of B may be written (formally) by way of non-limiting example, additively or multiplicatively as follows.

$$B=(B_1+B_2)/2 \quad \text{(additive)}$$

$$B=B_1+B_2B_2AB_1 \quad \text{(multiplicative)}$$

Note that although the combination of two preconditioners is shown above, examples are not so limited; any number of preconditioners may be used.

In principle, the multiscale preconditioners $B_i$ can also be combined in other ways. For instance, some preconditioners may be applied adaptively, depending on how the simulation develops; some may be applied independent of each other; while others may be applied in sequence. The benefit of various examples is that features in the reservoir model that affect reservoir pressure, such as faults, fractures, wells that gets turned on or exhibit large changes in well controls, can be addressed by distinct fit-for-purpose multiscale approximations in a very flexible and efficient manner. That each prolongation operator forms a partition of unity makes it very easy to enable or disable individual multiscale preconditioners during the course of a simulation run. This would be hard to achieve if the different and specialized basis functions were lumped together in a single multiscale method.

Between the applications of each multiscale preconditioner $B_i$, the basis functions (i.e., columns of $P_i$) and the shape and extent of coarse grid blocks $\Omega_i$ and support regions $S_i$ can be updated (block 404) to reflect changes in driving forces and in reservoir and fluid properties.

Figure 5:
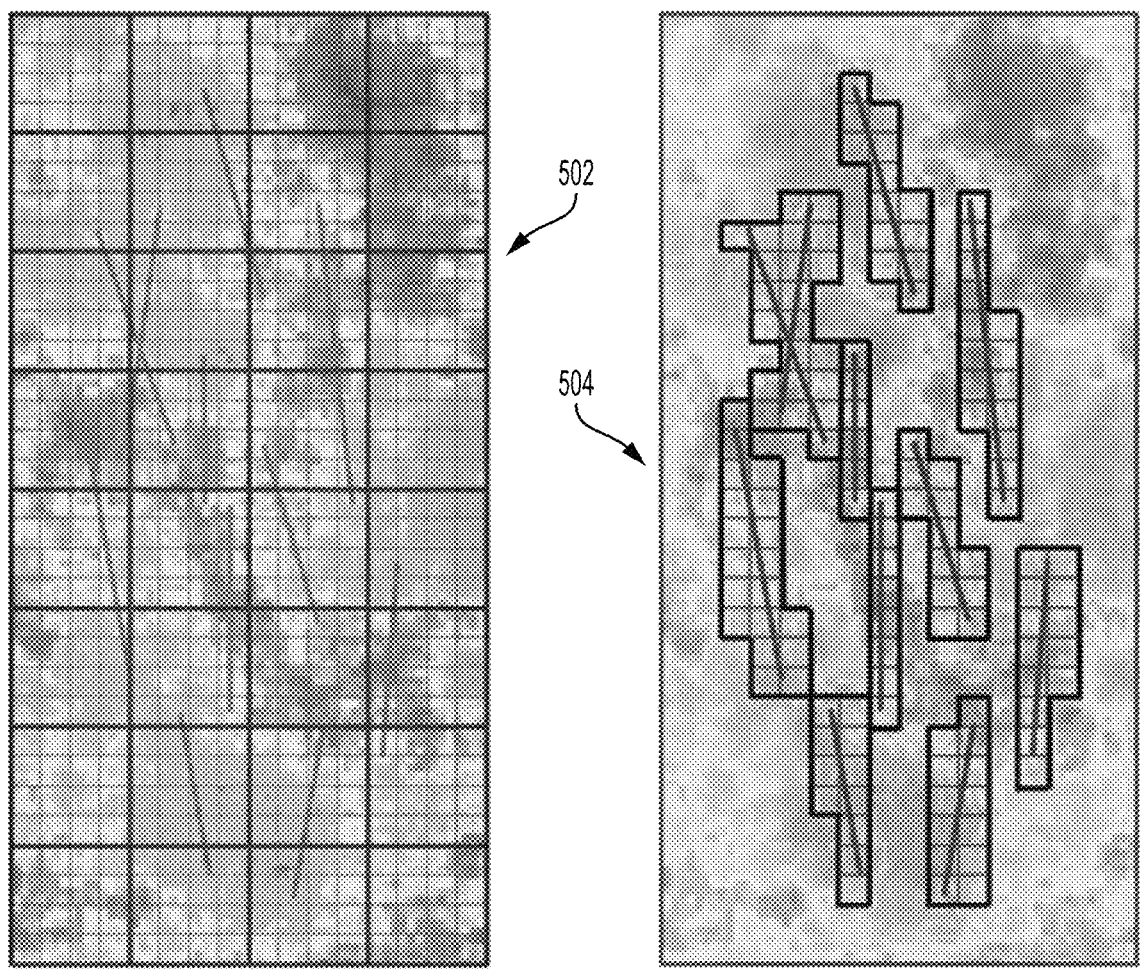
FIG. 5 illustrates an example of multiple coarse grids according to some examples.

FIG. 5 illustrates an example of multiple coarse grids according to some examples. In particular, FIG. 5 shows a background multiscale grid 502 that captures reservoir heterogeneity while a separate local multiscale grid 504 captures the effect of fractures. The grids of FIG. 5 provide one example of features used for implementing an adaptive multi-fidelity multiscale technique as disclosed herein.

Multiscale methods have been proposed as approximate linear solvers for the solution of the pressure equation for problems in porous media. To get good convergence properties, the coarse scale operators may be capable of capturing the global flow field, stable and account for unstructured features such as faults and eroded cells. The approaches described herein may efficiently improve the convergence rate and stabilize control volume-type operators on unstructured grids.

Figure 6:
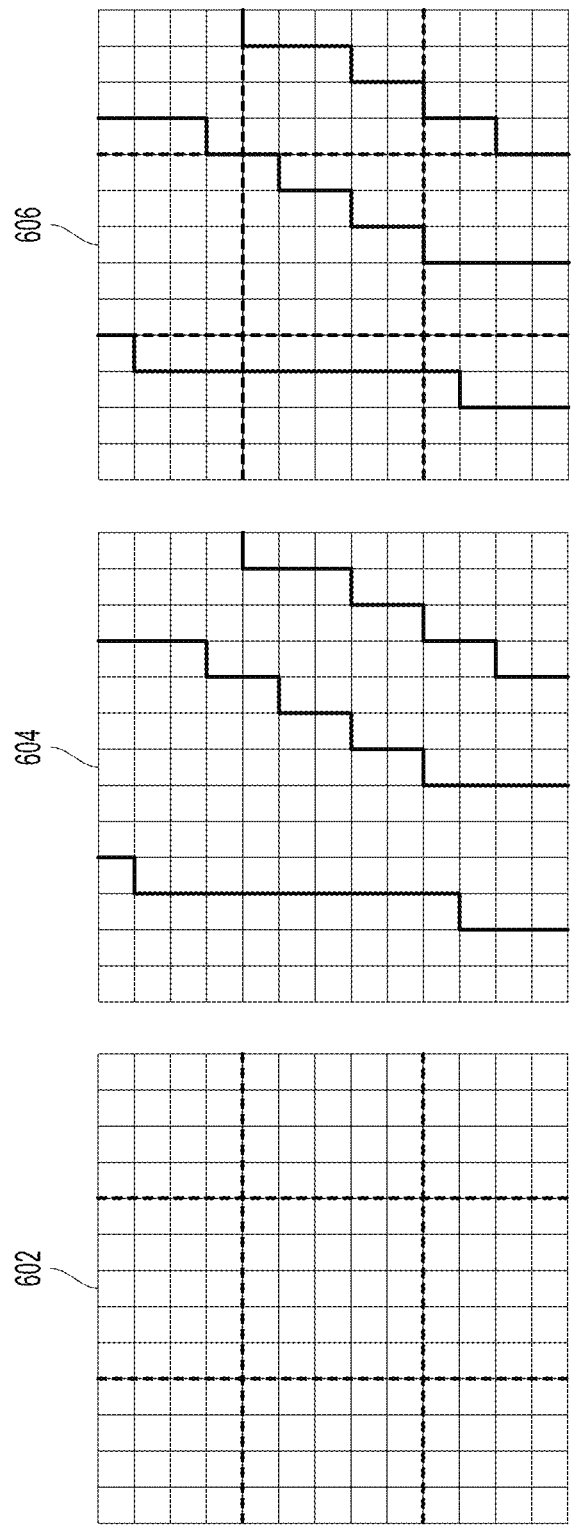
FIG. 6 illustrates example multiple coarse grids suitable for flux reconstruction.

FIG. 6 illustrates examples of multiple coarse grids suitable for flux reconstruction. In particular, FIG. 6 depicts a first grid 602 and a second grid 604. FIG. 6 also depicts block resulting from the geometric intersection 606 of first coarse grid 602 and second coarse grid 604. Examples can use blocks from first coarse grid 602, from second coarse grid 604, or blocks resulting from the geometric intersection 606 of first coarse grid 602 and second coarse grid 604.

The combination of many multiscale approximations fits well into the rest of the solution framework. Face (inter-cell) fluxes on the fine grid can be calculated directly from the pressure solution using Darcy's law, or the fluxes can optionally be reconstructed from fluxes across block boundaries within a coarse grid. In the latter case, the reconstruction can be performed as in the original multiscale methods. The coarse blocks used for this procedure can be chosen as any of the N coarse grids or the intersection between two or more of these coarse grids, see FIG. 6. This flexibility is an improvement over multiscale methods based on a single coarse grid.

When fluxes are computed on the fine grid, the fluid distribution at the end of the time step (i.e., saturations $S_\alpha$ and molar fractions $x_{i\alpha}$) can be computed by solving mass-balance equations with phase fluxes written in terms of total volumetric flux, as described in Section I.

The complete process can be repeated for the current time step (the outer iteration in FIG. 4) to ensure improved consistency between reservoir pressure, fluid saturations, and molar fractions at the end of the time step. Once sufficient accuracy is achieved, one moves on to compute the next time step using the same procedure, this continues until the simulation ends.

The coarse partitions may be formed in many different ways. Partition methods include, but are not restricted to:

Partitions formed by rectilinear or structured subdivision in physical space or in index space;

(Un)structured mesh partitions generated by graph partitioning algorithms;

Partitions that adapt to geological features such as facies, rock types, saturation regions, geological layers, faults, etc., or to other meta-information coming from the geological modelling tool;

Partitions arising from block-structured gridding or local grid refinement (LGR) or local coarsening;

Partitions resulting from agglomeration of grid cells based on indicator functions that can be set by the user, derived from the geological model, or from a pre-existing simulation; and Partitions based on error measures or indicators.

Figure 7:
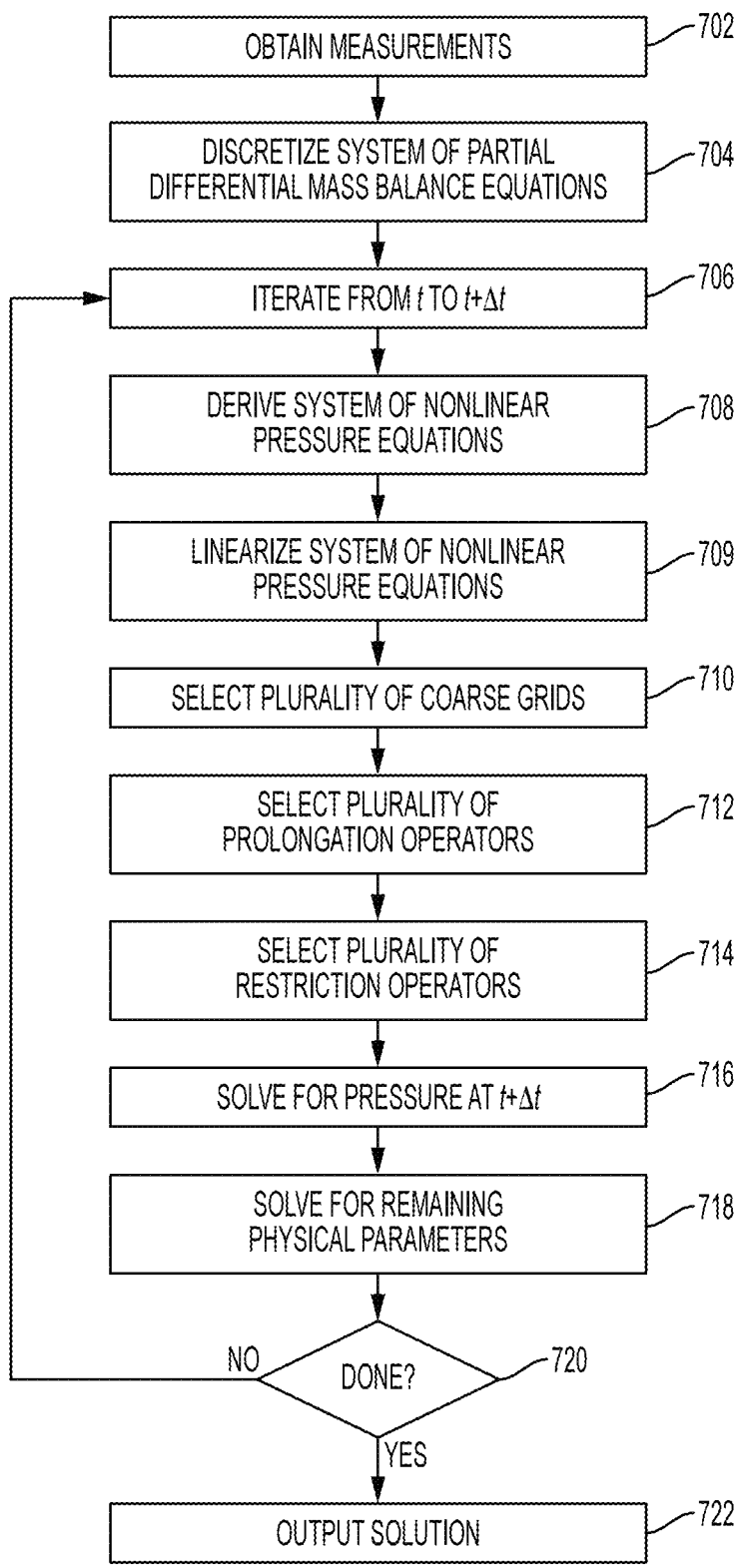
FIG. 7 is a flowchart illustrating an example process according to disclosed examples.

FIG. 7 is a flowchart illustrating an example process according to disclosed examples. FIG. 7 elaborates upon and provides context to the process shown and described in reference to FIG. 4. The process of FIG. 7 may be implemented to simulate a reservoir (or reservoirs) and make decisions about petroleum extraction, for example. For example, the process of FIG. 7 may be used to simulate the behavior of an existing reservoir. Alternately, or in addition, the process of FIG. 7 may be used to simulate the behavior of a reservoir after a proposed, but not-yet-carried-out, modification to the reservoir. Reservoir (or reservoirs) suitable for implementation of the process of FIG. 7 are shown and described above in reference to FIG. 1. Decisions about petroleum extraction that may be determined by the process of FIG. 7 include, by way of non-limiting example, increasing or decreasing extraction rates, adding or removing a wellbore, adding, increasing, decreasing, or removing a drilling fluid source, and selecting a wellbore location. These modifications may be simulated prior to being physically implemented. The process of FIG. 7 may be carried out at least partially using the system shown and described in reference to FIG. 8.

At block 702, the process obtains a plurality of measurements of a plurality of physical parameters at a plurality of locations within the reservoir. The physical parameters include at least pressure. Other physical parameters include, by way of non-limiting example, fluid masses, mass fractions, fluid volumes, saturations, fluxes, flow rates, densities, etc. The measurements may be obtained in a variety of ways. For example, the measurements may be obtained directly, e.g., by reading tools positioned to acquire physical measurements within the reservoir. Alternately, or in addition, the measurements may be obtained by retrieving previously-acquired measurements from electronic persistent storage or over a network, for example.

At block 704, the process discretizes, based on a three-dimensional fine grid imposed within the reservoir, a system of partial differential mass balance equations that model, based on the plurality of measurements from block 702, the plurality of physical parameters at the plurality of locations within the reservoir, either as it currently exists or with a proposed modification implemented. This process may be performed once as part of a set-up procedure, for example. The discretizing produces a system of nonlinear equations, e.g., the system of nonlinear equations of Equation (1), above.

At block 706, the process initiates an iteration. The iteration may iterate from a current time step to a next time step. Performed repeatedly, this recursive process generates a solution to the system of nonlinear equations for a time interval that includes the current time step and the next time step. The time interval may be any amount of time, e.g., from one minute to one year or longer.

At block 708, the process derives a system of nonlinear pressure equations from the system of nonlinear equations. This part of the process is described above in reference to Equations (1) and (2).

At block 709, the process linearizes the system of nonlinear pressure equations to obtain a system of linearized pressure equations. This part of the process is described above in reference to Equations (2) and (3).

At block 710, the process selects a plurality of three-dimensional coarse grids, where each coarse grid is a non-overlapping partition of the fine grid used at block 704. The coarse grids may be selected as described herein in reference to, e.g., FIGS. 2-6. Each coarse grid may account for one or more separate reservoir properties, features, or actions as discussed in detail herein.

At block 712 the process selects a plurality of prolongation operators, and at block 714 the process selects a plurality of restriction operators. The prolongation and restriction operators may be selected as described herein. For example, each pair of prolongation and restriction operators may account for one or more separate reservoir properties, features, or actions as discussed in detail herein.

At block 716, the process solves for pressure for the next time step at the plurality of locations within the reservoir based on a solution to the system of linearized pressure equations. This process is described in detail herein, e.g., in reference to Equations (7)-(10). This block may include applying the plurality of prolongation operators of block 712 and the plurality of restriction operators of block 714 to the system of linearized pressure equations of block 709 to generate a reduced-dimension system of linear pressure equations, e.g., as Equation (8). The reduced-dimension system of linear pressure equations has a lower dimensionality than a dimensionality of the system of linearized pressure equations of block 709.

At block 718, the process solves for the remaining physical parameters. In more detail, at block 718, the process determines, based on the pressure for the next time step at the plurality of locations within the reservoir, values for physical parameters at the plurality of locations within the reservoir for the next time step. This may be accomplished as described herein in reference to FIG. 4, blocks 410 and 412, FIG. 6, and Section II throughout, above.

At block 720, the process determines whether the iteration should halt. This may be based on convergence, or based on sufficient convergence, e.g., by determining that a difference between a current iteration value and a next iteration value does not exceed some predefined threshold.

At block 722, the process outputs the solution to the system of nonlinear equations for the time interval. The output may be by way of displaying a representation of the solution or displaying numeric values of the solution. The output may be made to another machine or process. Other output techniques are also possible.

Thus, the generated model may specify flow rates and pressure values at designated locations within the pipe system for any point in time. After block 722, the process may continue by using the solution to make determinations about petroleum extraction. Such determinations include, by way of non-limiting example, whether to implement modeled but not-yet-implemented changes to the reservoir. Such changes include, for example, adding an additional well, injecting water or another drilling fluid, or increasing the extraction of the product fluid, e.g., a petroleum mixture.

In more detail, the model for the existing pipe system may be subsequently (or originally) modified to represent a proposed, not-yet-implemented modification to the pipe system. The modification may include utilizing additional base and/or constraint equations. The modification may represent adding an additional wellbore, injecting water or another drilling fluid, or increasing the extraction of the product fluid, e.g., a petroleum mixture. The modified solution may be implemented on an electronic computing system, and may predict flow rates and pressures within the pipe system at any moment in time.

The process of FIG. 7 may conclude by implementing a proposed change to the reservoir, or by continuing (or beginning) extraction with the reservoir as-is.

Examples of the disclosure may also include one or more systems for implementing one or more examples of the method of simulation.

Figure 8:
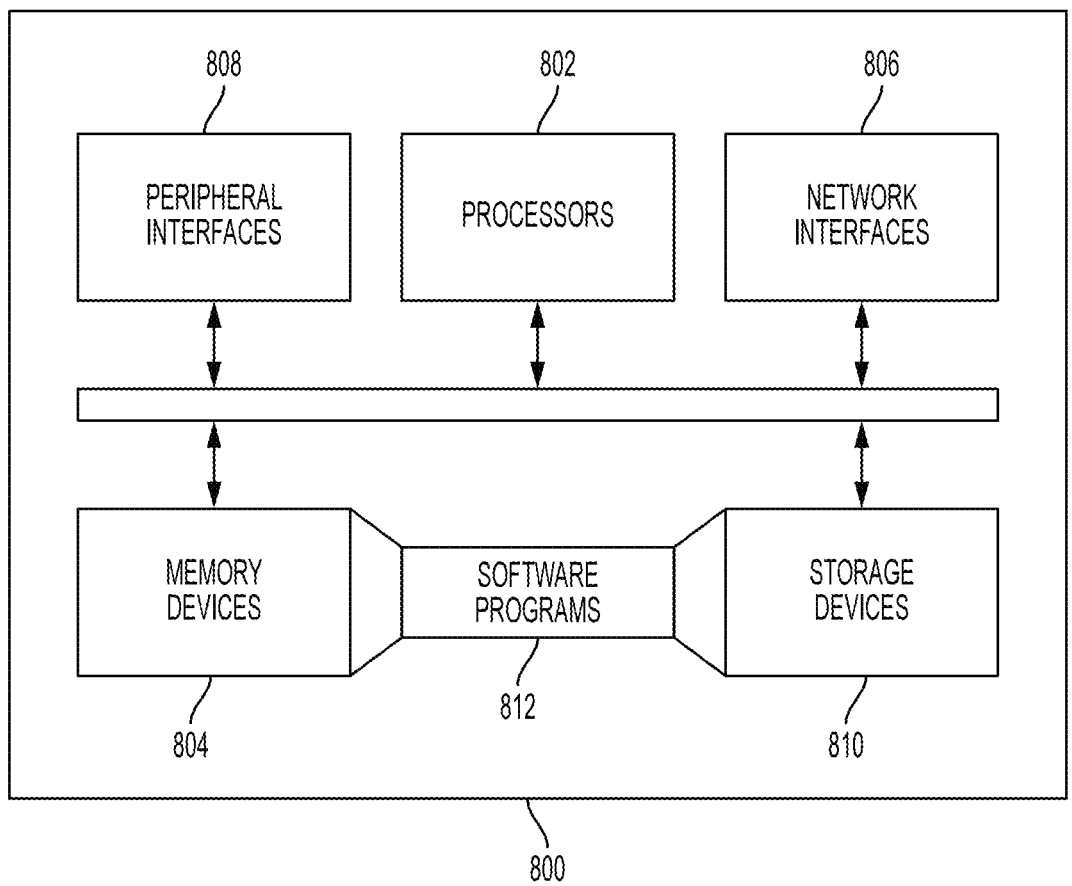
FIG. 8 illustrates a schematic view of a system according to various examples.

FIG. 8 illustrates a schematic view of such a computing or processor system 800, according to an example. The processor system 800 may include one or more processors 802 of varying core configurations (including multiple cores) and clock frequencies. The one or more processors 802 may be operable to execute instructions, apply logic, etc. It will be appreciated that these functions may be provided by multiple processors or multiple cores on a single chip operating in parallel and/or communicably linked together. In at least one example, the one or more processors 802 may be or include one or more GPUs.

The processor system 800 may also include a memory system, which may be or include one or more memory devices and/or computer-readable media 804 of varying physical dimensions, accessibility, storage capacities, etc. such as flash drives, hard drives, disks, random access memory, etc., for storing data, such as images, files, and program instructions for execution by the processor 802. In an example, the computer-readable media 804 may store instructions that, when executed by the processor 802, are configured to cause the processor system 800 to perform operations. For example, execution of such instructions may cause the processor system 800 to implement one or more portions and/or examples of the method(s) described above, e.g., the methods of FIGS. 4 and/or 7.

The processor system 800 may also include one or more network interfaces 806. The network interfaces 806 may include any hardware, applications, and/or other software. Accordingly, the network interfaces 806 may include Ethernet adapters, wireless transceivers, PCI interfaces, and/or serial network components, for communicating over wired or wireless media using protocols, such as Ethernet, wireless Ethernet, etc.

As an example, the processor system 800 may be a mobile device that includes one or more network interfaces for communication of information. For example, a mobile device may include a wireless network interface (e.g., operable via one or more IEEE 802.11 protocols, ETSI GSM, BLUETOOTH®, satellite, etc.). As an example, a mobile device may include components such as a main processor, memory, a display, display graphics circuitry (e.g., optionally including touch and gesture circuitry), a SIM slot, audio/video circuitry, motion processing circuitry (e.g., accelerometer, gyroscope), wireless LAN circuitry, smart card circuitry, transmitter circuitry, GPS circuitry, and a battery. As an example, a mobile device may be configured as a cell phone, a tablet, etc. As an example, a method may be implemented (e.g., wholly or in part) using a mobile device. As an example, a system may include one or more mobile devices.

The processor system 800 may further include one or more peripheral interfaces 808, for communication with a display, projector, keyboards, mice, touchpads, sensors, other types of input and/or output peripherals, and/or the like. In some implementations, the components of processor system 800 need not be enclosed within a single enclosure or even located in close proximity to one another, but in other implementations, the components and/or others may be provided in a single enclosure. As an example, a system may be a distributed environment, for example, a so-called "cloud" environment where various devices, components, etc. interact for purposes of data storage, communications, computing, etc. As an example, a method may be implemented in a distributed environment (e.g., wholly or in part as a cloud-based service).

As an example, information may be input from a display (e.g., a touchscreen), output to a display or both. As an example, information may be output to a projector, a laser device, a printer, etc. such that the information may be viewed. As an example, information may be output stereographically or holographically. As to a printer, consider a 2D or a 3D printer. As an example, a 3D printer may include one or more substances that can be output to construct a 3D object. For example, data may be provided to a 3D printer to construct a 3D representation of a subterranean formation. As an example, layers may be constructed in 3D (e.g., horizons, etc.), geobodies constructed in 3D, etc. As an example, holes, fractures, etc., may be constructed in 3D (e.g., as positive structures, as negative structures, etc.).

The memory device 804 may be physically or logically arranged or configured to store data on one or more storage devices 810. The storage device 810 may include one or more file systems or databases in any suitable format. The storage device 810 may also include one or more software programs 812, which may contain interpretable or executable instructions for performing one or more of the disclosed processes. When requested by the processor 802, one or more of the software programs 812, or a portion thereof, may be loaded from the storage devices 810 to the memory devices 804 for execution by the processor 802.

Those skilled in the art will appreciate that the above-described componentry is merely one example of a hardware configuration, as the processor system 800 may include any type of hardware components, including any accompanying firmware or software, for performing the disclosed implementations. The processor system 800 may also be implemented in part or in whole by electronic circuit components or processors, such as application-specific integrated circuits (ASICs) or field-programmable gate arrays (FPGAs).

The foregoing description of the present disclosure, along with its associated examples, has been presented for purposes of illustration. It is not exhaustive and does not limit the present disclosure to the precise form disclosed. Those skilled in the art will appreciate from the foregoing description that modifications and variations are possible in light of the above teachings or may be acquired from practicing the disclosed examples.

For example, the same techniques described herein with reference to the processor system 800 may be used to execute programs according to instructions received from another program or from another processor system altogether. Similarly, commands may be received, executed, and their output returned entirely within the processing and/or memory of the processor system 800. Accordingly, neither a visual interface command terminal nor any terminal is strictly necessary for performing the described examples.

Likewise, the steps described need not be performed in the same sequence discussed or with the same degree of separation. Various steps may be omitted, repeated, combined, or divided, as appropriate to achieve the same or similar objectives or enhancements. Accordingly, the present disclosure is not limited to the above-described examples, but instead is defined by the appended claims in light of their full scope of equivalents. Further, in the above description and in the below claims, unless specified otherwise, the term "execute" and its variants are to be interpreted as pertaining to any operation of program code or instructions on a device, whether compiled, interpreted, or run using other techniques. In the claims that follow, section 112 paragraph sixth is not invoked unless the phrase "means for" is used.

Some disclosed examples can be used to implement an adaptive framework for multiscale approximations that can improve the accuracy and robustness in comparison to existing multiscale solver engines. Existing state-of-the-art multiscale technology uses a coarse and a fine scale to approximate reservoir flow. In contrast, for some examples, instead of using a single coarse grid to approximate all relevant features of a simulation model, the disclosed framework permits many coarse grids to be used, each with resolution tailored for a particular set of model features. As such, the proposed idea is a truly multiscale. For instance, this framework can enable better approximation of complex geometry and high-contrast geology with long correlation lengths such as river beds, channels and fractured zones, fault zones with uncertain properties. Also, the new approach may be used to enable local enrichment of the multiscale approximation near wells, or even dynamically to follow distinct features in the solution such as displacement fronts, chemical slugs, etc.

What is claimed is:

1. A computer-implemented method for modeling behavior of at least one fluid in a reservoir, the method comprising:
   obtaining a plurality of measurements of a plurality of physical parameters at a plurality of locations within the reservoir, the plurality of physical parameters comprising at least pressure, wherein the plurality of measurements are obtained via reading tools or by retrieving previously-acquired measurements;
   discretizing, based on a three-dimensional fine grid, a system of partial differential mass balance equations that model, based on the plurality of measurements, at least the plurality of physical parameters at the plurality of locations within the reservoir, whereby a system of nonlinear equations is produced;

iterating from a current time step to a next time step, whereby a solution to the system of nonlinear equations for a time interval that includes the current time step and the next time step is produced by performing operations comprising:
  deriving a system of nonlinear pressure equations from the system of nonlinear equations, wherein the system of nonlinear equations is different from the system of nonlinear pressure equations;
  linearizing the system of nonlinear pressure equations to obtain a system of linearized pressure equations;
  selecting a plurality of three-dimensional coarse grids, wherein each coarse grid comprises a non-overlapping partition of the fine grid used to discretize the system of partial differential mass balance equations;
  selecting a plurality of prolongation operators, each prolongation operator associated with a respective coarse grid of the plurality of course grids;
  selecting a plurality of restriction operators, each restriction operator associated with a respective coarse grid of the plurality of course grids,
  wherein the plurality of prolongation operators and the plurality of restriction operators are selected based on one or more separate reservoir properties, features, or actions;
  solving for pressure for the next time step at the plurality of locations within the reservoir based on a solution to the system of linearized pressure equations, wherein the solving for the pressure for the next time step comprises applying the selected plurality of prolongation operators and the selected plurality of restriction operators to the system of linearized pressure equations to generate a reduced dimension system of linear pressure equations, wherein the reduced-dimension system of linear pressure equations has a lower dimensionality than a dimensionality of the system of linearized pressure equations; and
  determining physical parameters at the plurality of locations within the reservoir for the next time step, wherein the physical parameters are determined by solving for the pressure for next time step by applying the selected plurality of prolongation operators and the selected plurality of restriction operators to the system of linearized pressure equations to generate a reduced dimension system of linear pressure equations; and
  outputting the solution to the system of nonlinear equations for the time interval, wherein the outputted solution is used to modify the reservoir or modify a pipe system.

2. The method of claim 1, wherein the solving for pressure at the next time step at the plurality of locations within the reservoir based on a solution to the system of linearized pressure equations comprises iteratively:
  applying at least one prolongation operator of the selected plurality of prolongation operators to a free variable representing a solution to the system of linearized pressure equations; and
  applying at least one restriction operator of the selected plurality of restriction operators to both sides of the system of linearized pressure equations, whereby the reduced-dimension system of linear pressure equations is produced.

3. The method of claim 2, wherein the solving for pressure at the next time step at the plurality of locations within the reservoir based on a solution to the system of linearized pressure equations further comprises iteratively applying a local linear solver for the linearized pressure equations to a prolongation of a solution to the reduced-dimension system of linear equations.

4. The method of claim 1, wherein:
  each column of each prolongation operator of the plurality of prolongation operators has an associated support that is compact and includes a coarse grid block from a respective coarse grid; and
  each prolongation operator of the plurality of prolongation operators consists of a plurality of columns that form a partition of unity over the fine grid.

5. The method of claim 4, wherein each row of each prolongation operator of the plurality of prolongation operators sums to unity.

6. The method of claim 1, wherein the outputting comprises displaying a representation of a behavior of the at least one fluid in the reservoir.

7. The method of claim 1, further comprising:
  predicting fluid behavior in the reservoir based on the solution to the system of nonlinear equations for the time interval; and
  extracting fluid from the reservoir based on the predicting.

8. The method of claim 1, wherein the iterating from the current time step to the next time step is performed in parallel by at least one hardware graphics processing unit.

9. The method of claim 1, wherein the physical parameters comprise pressure, flow rate, and composition.

10. The method of claim 1, wherein the system of partial differential mass balance equations that model at least the plurality of physical parameters at the plurality of locations within the reservoir further model a modification of the reservoir.

11. A non-transitory computer-readable medium containing instructions which, when executed by at least one electronic processor, perform a method for modeling behavior of at least one fluid in a reservoir, the method comprising:
  obtaining a plurality of measurements of a plurality of physical parameters at a plurality of locations within the reservoir, the plurality of physical parameters comprising at least pressure, wherein the plurality of measurements are obtained via reading tools or by retrieving previously-acquired measurements;
  discretizing, based on a three-dimensional fine grid, a system of partial differential mass balance equations that model, based on the plurality of measurements, at least the plurality of physical parameters at the plurality of locations within the reservoir, whereby a system of nonlinear equations is produced;
  iterating from a current time step to a next time step, whereby a solution to the system of nonlinear equations for a time interval that includes the current time step and the next time step is produced by performing operations comprising:
    deriving a system of nonlinear pressure equations from the system of nonlinear equations, wherein the system of nonlinear equations is different from the system of nonlinear pressure equations;
    linearizing the system of nonlinear pressure equations to obtain a system of linearized pressure equations;
    selecting a plurality of three-dimensional coarse grids, wherein each coarse grid comprises a non-overlapping partition of the fine grid used to discretize the system of partial differential mass balance equations;
    selecting a plurality of prolongation operators, each prolongation operator associated with a respective coarse grid of the plurality of course grids;

selecting a plurality of restriction operators, each restriction operator associated with a respective coarse grid of the plurality of course grids, wherein the plurality of prolongation operators and the plurality of restriction operators are selected based on one or more separate reservoir properties, features, or actions;

solving for pressure for the next time step at the plurality of locations within the reservoir based on a solution to the system of linearized pressure equations, wherein the solving for the pressure for the next time step comprises applying the selected plurality of prolongation operators and the selected plurality of restriction operators to the system of linearized pressure equations to generate a reduced dimension system of linear pressure equations, wherein the reduced-dimension system of linear pressure equations has a lower dimensionality than a dimensionality of the system of linearized pressure equations; and determining physical parameters at the plurality of locations within the reservoir for the next time step, wherein the physical parameters are determined by solving for the pressure for next time step by applying the selected plurality of prolongation operators and the selected plurality of restriction operators to the system of linearized pressure equations to generate a reduced dimension system of linear pressure equations; and outputting the solution to the system of nonlinear equations for the time interval, wherein the outputted solution is used to modify the reservoir or modify a pipe system.

12. The computer-readable medium of claim 11, wherein the solving for pressure at the next time step at the plurality of locations within the reservoir based on a solution to the system of linearized pressure equations comprises iteratively:

applying at least one prolongation operator of the selected plurality of prolongation operators to a free variable representing a solution to the system of linearized pressure equations; and applying at least one restriction operator of the selected plurality of restriction operators to both sides of the system of linearized pressure equations, whereby the reduced-dimension system of linear pressure equations is produced.

13. The computer-readable medium of claim 12, wherein the solving for pressure at the next time step at the plurality of locations within the reservoir based on a solution to the system of linearized pressure equations further comprises iteratively applying a local linear solver for the linearized pressure equations to a prolongation of a solution to the reduced dimension system of linear equations.

14. The computer-readable medium of claim 11, wherein:
each column of each prolongation operator of the plurality of prolongation operators has an associated support that is compact and includes a coarse grid block from a respective coarse grid; and
each prolongation operator of the plurality of prolongation operators consists of a plurality of columns that form a partition of unity over the fine grid.

15. The computer-readable medium of claim 14, wherein each row of each prolongation operator of the plurality of prolongation operators sums to unity.

16. The computer-readable medium of claim 11, wherein the outputting comprises displaying a representation of a behavior of the at least one fluid in the reservoir.

17. The computer-readable medium of claim 11, further containing instructions which, when executed by the at least one electronic processor, further perform a method comprising:

predicting fluid behavior in the reservoir based on the solution to the system of nonlinear equations for the time interval; and extracting fluid from the reservoir based on the predicting.

18. The computer-readable medium of claim 11, wherein the iterating from the current time step to the next time step is performed in parallel by at least one hardware graphics processing unit.

19. The computer-readable medium of claim 11, wherein the physical parameters comprise pressure, flow rate, and composition.

20. The computer-readable medium of claim 11, wherein the system of partial differential mass balance equations that model at least the plurality of physical parameters at the plurality of locations within the reservoir further model a modification of the reservoir.

* * * * *